(12) United States Patent
Larisch

(10) Patent No.: US 10,804,667 B2
(45) Date of Patent: Oct. 13, 2020

(54) DEVICE FOR AUTOMATICALLY MOUNTING A CONNECTOR-HOUSING

(71) Applicant: Delphi Technologies, Inc., Troy, MI (US)

(72) Inventor: Markus Larisch, Wuppertal (DE)

(73) Assignee: DELPHI TECHNOLOGIES, INC., Troy, MI (US)

( * ) Notice: Subject to any disclaimer, the term of this patent is extended or adjusted under 35 U.S.C. 154(b) by 339 days.

(21) Appl. No.: 15/318,704

(22) PCT Filed: Jun. 15, 2015

(86) PCT No.: PCT/EP2015/063350
§ 371 (c)(1),
(2) Date: Dec. 14, 2016

(87) PCT Pub. No.: WO2015/193248
PCT Pub. Date: Dec. 23, 2015

(65) Prior Publication Data
US 2017/0133809 A1 May 11, 2017

(30) Foreign Application Priority Data
Jun. 16, 2014 (EP) .................................. 14172588

(51) Int. Cl.
*H01R 43/20* (2006.01)
*H01R 43/28* (2006.01)
(Continued)

(52) U.S. Cl.
CPC ............. *H01R 43/20* (2013.01); *H01R 43/28* (2013.01); *H05K 13/041* (2018.08);
(Continued)

(58) Field of Classification Search
CPC .... H01R 43/20; H01R 43/28; H05K 13/0409; H05K 13/041; H05K 13/0812;
(Continued)

(56) References Cited

U.S. PATENT DOCUMENTS

| | | | | |
|---|---|---|---|---|
| 5,083,863 A | * | 1/1992 | Cerda | H01R 43/20 250/223 R |
| 5,084,962 A | * | 2/1992 | Takahashi | Y10T 29/49131 29/833 |
| 5,588,206 A | * | 12/1996 | Maejima | H01R 43/20 29/748 |
| 5,727,312 A | * | 3/1998 | Maejima | H01R 43/20 29/33 M |

(Continued)

FOREIGN PATENT DOCUMENTS

| CN | 1457230 A | 11/2003 |
|---|---|---|
| CN | 101847817 A | 9/2010 |

(Continued)

OTHER PUBLICATIONS

Machine Translation of European Patent Publication, EP 2 461 433, Apr. 2020. (Year: 2012).*

*Primary Examiner* — A. Dexter Tugbang
(74) *Attorney, Agent, or Firm* — Billion & Armitage; Robert Myers

(57) ABSTRACT

A device for automatically mounting a connector-housing with a contact-part attached to an electrical line includes a holder, a movable-gripper, an alignment-station, a camera, and a control-device. The holder fixes the connector-housing. The movable-gripper holds the contact-part and inserts the contact-part into a cavity of the connector-housing. The alignment-station includes an alignment-gripper that holds the contact-part and rotates the contact-part about a rotation-axis parallel to an insertion-direction. The camera determines an actual-rotational-position of the contact-part held by the alignment-gripper in relation to the rotation-axis. The control-device compares the actual-rotational-position with a predetermined-rotational-position based on the characteristics and arrangement of the connector-housing. The con- (Continued)

trol-device further controls the alignment-gripper to perform a corrective rotational movement based on the result of the comparison.

18 Claims, 7 Drawing Sheets

(51) Int. Cl.
  *H05K 13/08* (2006.01)
  *H05K 13/04* (2006.01)
(52) U.S. Cl.
  CPC ..... *H05K 13/0409* (2018.08); *H05K 13/0812* (2018.08); *Y10T 29/49131* (2015.01); *Y10T 29/49133* (2015.01); *Y10T 29/53209* (2015.01); *Y10T 29/53213* (2015.01)
(58) Field of Classification Search
  CPC ......... Y10T 29/49131; Y10T 29/49133; Y10T 29/53209; Y10T 29/53213
  See application file for complete search history.

(56) References Cited

U.S. PATENT DOCUMENTS

| | | |
|---|---|---|
| 6,043,877 A | 3/2000 | Land |
| 7,036,215 B2 | 5/2006 | Kodama |
| 2002/0042989 A1* | 4/2002 | Kawase ............ Y10T 29/49133 29/832 |
| 2002/0073536 A1* | 6/2002 | Okuda ............... H05K 13/0409 29/740 |
| 2003/0079342 A1* | 5/2003 | Revel ..................... H01R 43/20 29/854 |
| 2008/0256792 A1* | 10/2008 | Imai ....................... H01R 43/20 29/747 |
| 2009/0199396 A1 | 8/2009 | Shelley et al. |
| 2012/0304439 A1 | 12/2012 | Larisch |
| 2014/0081464 A1* | 3/2014 | Lu .......................... H01R 43/28 700/275 |

FOREIGN PATENT DOCUMENTS

| | | |
|---|---|---|
| CN | 202817460 U | 3/2013 |
| CN | 103454456 A | 12/2013 |
| EP | 2461433 A1 | 6/2012 |
| JP | 2007059286 A * | 3/2007 |

* cited by examiner

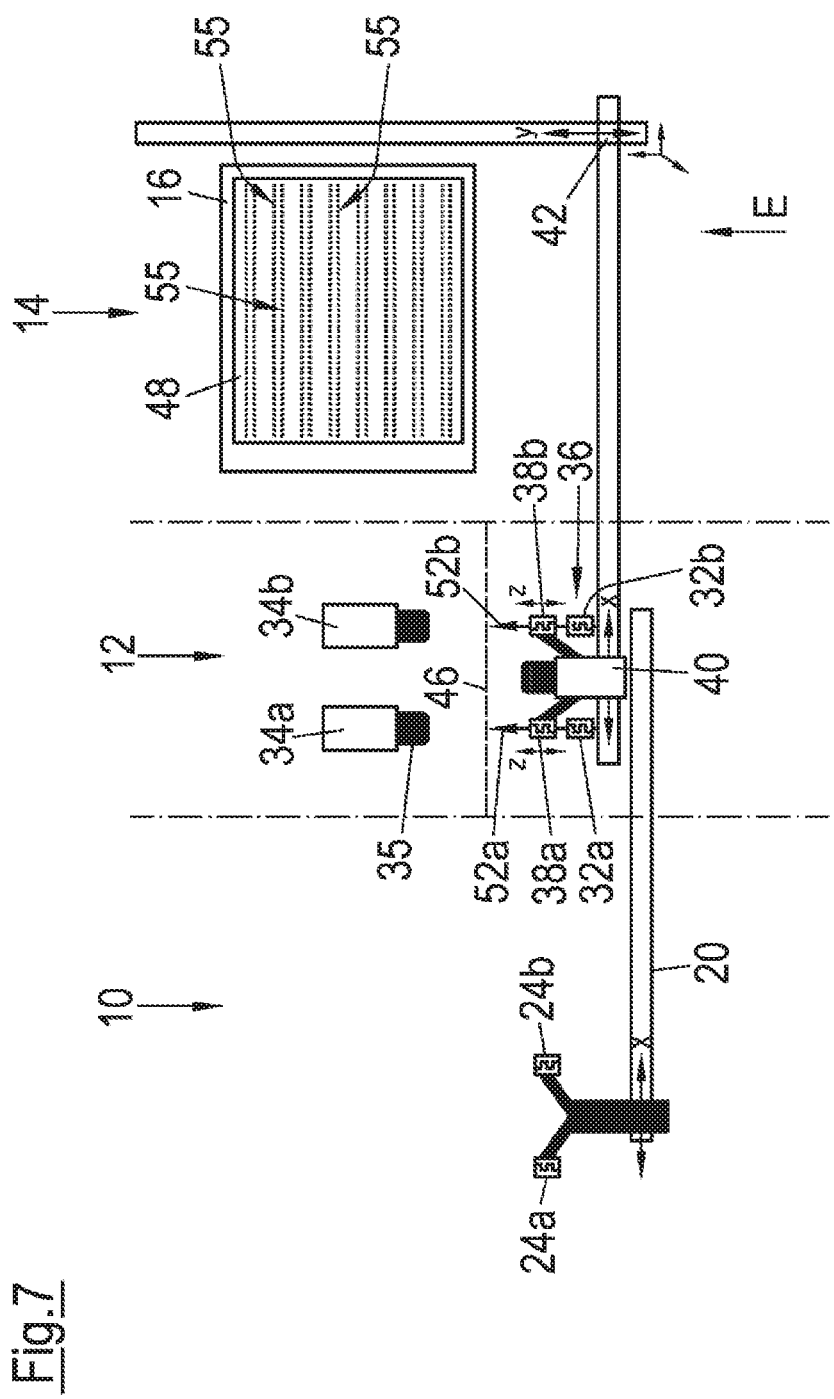

DEVICE FOR AUTOMATICALLY MOUNTING A CONNECTOR-HOUSING

CROSS-REFERENCE TO RELATED APPLICATION

This application claims the benefit under 35 U.S.C. § 371 of published PCT Patent Application Number PCT/EP 2015/063350, filed 15 Jun. 2015, claiming priority to European patent application number EP14172588.7 filed on 16 Jun. 2014, the entire contents of which is hereby incorporated by reference herein.

TECHNICAL FIELD OF INVENTION

This disclosure generally relates to a method for automatically mounting a connector-housing having a contact-part attached to an electrical line, wherein the connector-housing is fixed to a holder and the contact-part is inserted into a cavity of the connector-housing by means of a movable-gripper.

BACKGROUND OF INVENTION

The machine-based manufacturing of electrical line harnesses is often carried out with the use of robots or similar positioning devices that are equipped with grippers as end effectors. Usually, such a gripper holds a contact-part either directly or at the electrical line, moves it to the desired cavity and inserts it therein. Such a mounting method is disclosed in EP 2 461 433 A1. The term "connector-housing" is basically meant to be also a socket housing, a clamping bar or the like. To ensure a reliable and efficient mounting process, an accurate knowledge of the positions of the respective components of the system is required.

For cost reasons, neither the connector-housings nor the contact-parts of conventional electrical lines can be manufactured with strict tolerance allowances. Accordingly, inaccuracies regarding the positioning arise repeatedly when using common mounting-devices, whereby a reliable and efficient operation is made difficult.

SUMMARY OF THE INVENTION

In accordance with one embodiment, an alignment process is provided. The alignment process is carried out prior to insertion of a contact-part into a cavity, comprising the steps of:
(i) holding the contact-part, directly or at the electrical line, by means of an alignment-gripper or another gripper,
(ii) determining an actual-rotational-position of the held contact-part in relation to a rotation-axis extending in parallel to an insertion-direction,
(iii) comparing the determined actual-rotational-position with a rotational-position predetermined by the characteristics and arrangement of the connector-housing, and
(iv) performing a rotational-position-correction by means of the alignment-gripper holding the contact-part based on the result of the comparison.

The alignment process ensures that each provided contact-part is in the correct rotational-position before the insertion process. Thus, individual positional deviations can be compensated and the process reliability can be increased. In particular, it is possible to bring radial form features of a contact-part, such as crimping noses, flats, grooves or the like, into the position predetermined by the form of the cavity. The reliability of the mounting process can be considerably increased by the automatic rotational-position-correction.

Preferably, determining the actual-rotational-position of the contact-part in step (ii) is carried out by means of a camera directed onto the held contact-part. In particular, the camera may be the camera with an associated image-processing-system. The use of the camera allows for a contact-free and fast detection of the rotational-position of a contact-part.

Preferably, a lens of the camera is focused on a front-end-face of the held contact-part facing away from the electrical line. This ensures optimum recognition of radial form features or markings of the contact-part in a captured image.

In another embodiment, the alignment process further comprises the step of: (v) performing a height-position-correction by means of the alignment-gripper holding the contact-part, if an actual height-position of the held contact-part, which indicates an axial-position in relation to the rotation-axis of a front side of the contact-part facing away from the electrical line, deviates from a predetermined reference-height-position.

Deviations between the actual-height position and the predetermined reference-height-position may occur in particular due to tolerance-related length differences of the individually provided contact-parts. In the invention, it was recognized that such deviations often cause critical faulty positioning of contact-parts in the associated cavities. Such faulty positions may be prevented by an automatic height-position-correction. The distance between the alignment-gripper holding the contact-part and the contact-part tip is given by the protruding line length and the length of the contact-part. These two lengths are in general procedurally known and can be considered accordingly, so that the distance between the alignment-gripper and the contact-part tip is always constant during a subsequent mounting process.

In yet another embodiment, the holding of the contact-part in step (i) and the performing the rotational-position-correction in step (iv) is carried out by means of a rotatable alignment-gripper, which is separated from the mounting-gripper provided for insertion of the contact-part into the cavity, wherein the contact-part, after the rotational-position-correction in step (iv), is passed from the alignment-gripper to the mounting-gripper provided for insertion of the contact-part into the cavity while avoiding a further twist. Due to the provision of a separate alignment-gripper for the alignment process, the mounting-gripper provided for mounting is not affected by the alignment process and therefore can execute successive mounting operations without any delay. Thus, the efficiency of the entire system is not affected by the alignment process.

Preferably, the insertion of the contact-part into the cavity and the alignment process are carried out in spatially separated stations of a common mounting-device to ensure an efficient overall process.

In particular, while performing the alignment process at the alignment-station, a previously aligned contact-part can be inserted into a cavity of a connector-housing at the mounting-station. The throughput of a mounting system can thereby be increased.

Another embodiment of the invention provides that, while performing the alignment process, another subsequently to be aligned contact-part attached to an electrical line is taken from a contact-part supply by a movable supply-gripper and is placed into a supply-position. Thus, the overall process can be further accelerated since the supply-gripper can provide the contact-part already prepositioned for the alignment process.

According to a specific embodiment of the invention, at least two contact-parts are held at the same time in step (i) by means of a multi-gripper, which in step (iv) are subjected to a common rotational-position-correction by the multi-gripper. In particular, a double-gripper can be provided. Such a double-gripper enables an especially fast mounting process, particularly in the case where an electrical line with contact-parts attached at both ends for connecting two connector-housings is to be mounted.

In yet another embodiment, a device for automatically mounting a connector-housing with a contact-part attached to an electrical line, comprising a holder for fixing the connector-housing and a movable-gripper for inserting the contact-part into a cavity of the connector-housing. To achieve the above object, a mounting-device according to the invention comprises an alignment-station, comprising:
(i) at least one alignment-gripper, which is configured for holding the contact-part, directly or on the electric line, and rotating the held contact-part about an rotation-axis parallel to an insertion-direction;
(ii) a camera for determining an actual0rotational0position of the contact-part held by the alignment-gripper in relation to the rotation-axis; and
(iii) a control-device which is configured for comparing the determined actual-rotational-position with a rotational-position predetermined by the characteristics and arrangement of the connector-housing and for controlling the alignment-gripper so that it performs a corrective-rotational-movement based on the result of the comparison.

By providing an alignment-station with an alignment-gripper and a camera, the process reliability in an automatic mounting-device can be increased and the efficiency can be improved. In particular, the alignment-station can be procedurally arranged upstream from a mounting-station.

Preferably, the alignment-gripper is provided in addition to the mounting-gripper provided for insertion of the contact-part into the cavity. Thus, the mounting-gripper provided for mounting is not affected by the rotational-position-correction.

The alignment-gripper may be configured for rotating the held contact-part by at least 90°, preferably at least 180°. This allows for a rotational-position-correction even with comparatively large misalignments or from any initial positions. In particular, a rotation of the gripper in such a wide rotation-angle range facilitates the positioning of individual radial form features of the contact-part, such as crimping noses, flats, grooves and the like.

In yet another embodiment, the alignment-gripper is displaceable along the rotation-axis and/or perpendicular to the rotation-axis, preferably by means of a linear-positioning-system. In this way, the correction possibilities during the alignment process can be extended. The benefit of a linear-positioning-system compared to a robot is that no mathematical model related nonlinearities occur.

According to a specific embodiment, the alignment-gripper is configured for common holding and rotating of at least two contact-parts, in particular wherein each of the held contact-parts has its own associated camera. Multi-grippers allow for particularly fast mounting operations.

Preferably, the camera is arranged such that it is directed from a side facing away from the electrical line to the contact-part held by the alignment-gripper. The actual rotational-position of the contact-part is easily detectable from such a point of view.

In yet another embodiment, a mounting-camera is provided for determining the position of the connector-housing in relation to a predetermined reference-position, wherein the movable mounting-gripper and the mounting-camera form a mounting unit configured for common movement. In other words, a mounting unit with its own camera can be provided, so no measuring-station including associated drives is necessary. Between the mounting-camera image and the tip of the contact-part at the mounting-gripper, there is a fixed geometric relationship due to the common mobility. This results in a high degree of flexibility in relation to different mountings of a specific panel with connector-housings. The benefits of a mounting unit with its own mounting-camera are provided independently of the presence of an alignment-station, so for this aspect also independent protection is claimed.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which:

FIG. 7 depicts the mounting device of FIG. 1 during a calibration process in accordance with one embodiment.

DETAILED DESCRIPTION

Figure 1:
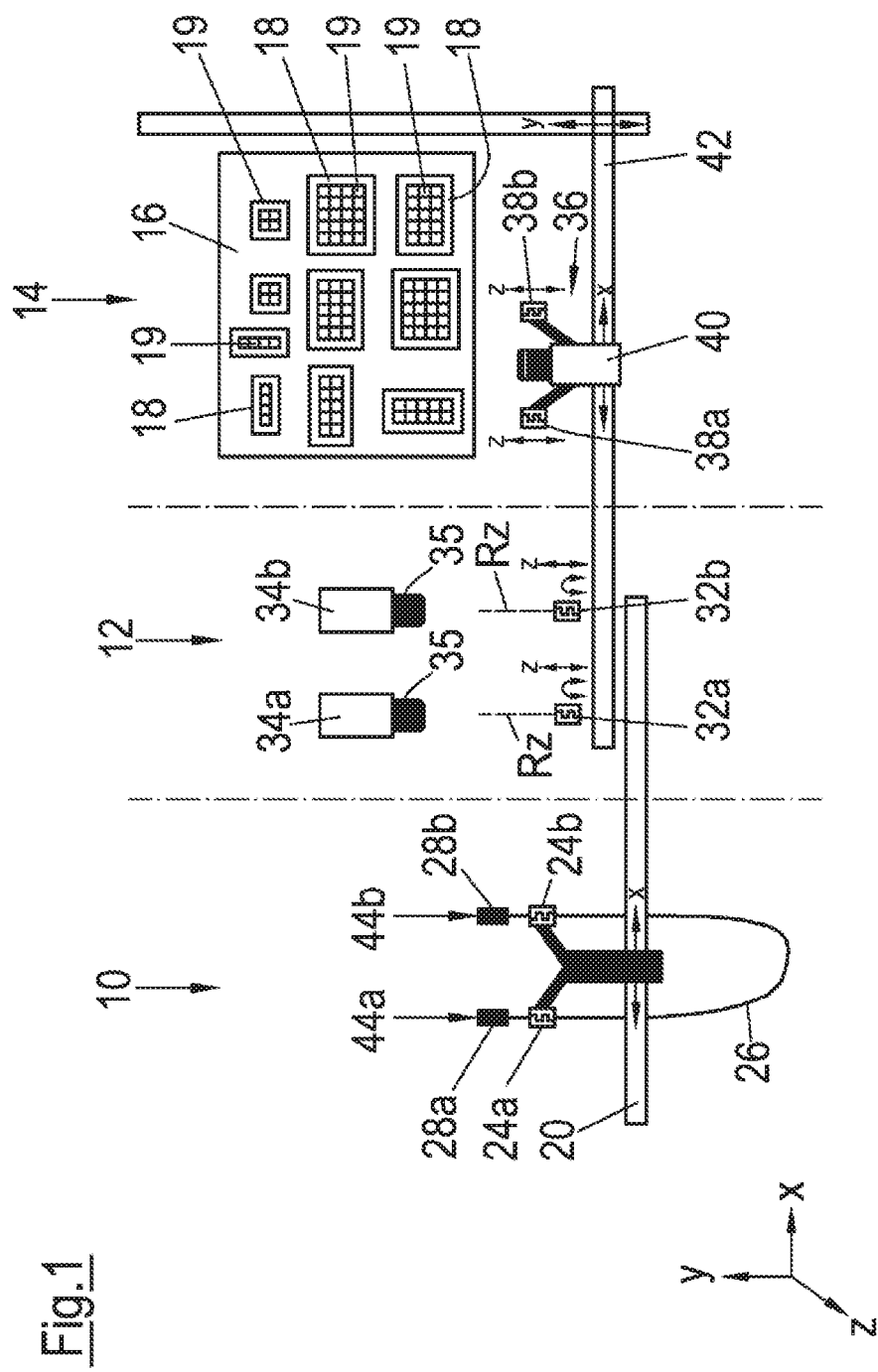
FIG. 1 is a simplified representation of a mounting-device during provision of an electrical line including two contact-parts attached thereto in accordance with one embodiment.

The mounting device illustrated in simplified form in the FIGS. 1 to 7 includes a supply-station 10, an alignment-station 12 and a mounting-station 14, which are arranged spatially separated, here in direct succession. A stationary fixable holder 16 for a plurality of connector-housings 18 is provided in the area of the mounting-station 14. In particular, the connector-housings 18 can be locked in receptacles of the panel-like holder 16, optionally using additional holders. The connector-housings 18 exemplified in different configurations each comprise several cavities 19.

A first-positioning-system 20, here in the form of a uniaxial linear system, is associated with the supply-station 10 and is used to move two adjacent supply-grippers 24a, 24b which are combined into a double-gripper. In FIG. 1 an electrical line 26 is recognizable in the area of the supply-station 10, which is provided at both ends with respective contact-parts 28a, 28b. Each of the contact-parts 28a, 28b is held at the electrical line 26 by one of the supply-grippers 24a, 24b. The supply-grippers 24a, 24b could also be configured for directly holding the contact-parts 28a, 28b.

Two adjacent alignment-grippers 32a, 32b are provided in the area of the alignment-station 12, which may also combined into a double-gripper dependent on the application. The alignment-grippers 32a, 32b may be similar in principle as the supply-grippers 24a, 24b. As shown by the curved double-arrows, the alignment-grippers 32a, 32b are each configured to be rotatable for rotating a held contact-part 28a, 28b about a rotation-axis Rz, preferably by 180°. In addition, the alignment-grippers 32a, 32b are each linearly displaceable along the rotation-axis Rz, as indicated by the straight double-arrows. Two alignment-cameras 34a, 34b including respective image-processing-systems, not shown, are arranged in the area of the alignment-station 12 and are directed to a respective one of the alignment-grippers 32a, 32b. The alignment-cameras 34a, 34b may also be connected to a common image-processing-system.

A mounting-unit 36 associated with the mounting-station 14 includes two mounting-grippers 38a, 38b and a mounting-camera 40 with associated own or higher-level image-processing-system. By means of a second-positioning-system 42, which is configured as a two-axis linear system, as shown, the mounting-unit 36 can be moved in front of the individual connector-housings 18 fixed to the holder 16. As shown, the first-positioning-system 20 and the second-positioning-system 42 overlap with each other in the area of the alignment-station 12, so that a transfer of held contact-parts 28a, 28b between the individual grippers is possible.

For reasons of clarity, in all figures the holder 16 with the fixed connector-housings 18 and the second-positioning-system 42 are depicted in a front-view, while the other components of the mounting device are shown in a plan-view.

Figure 2:
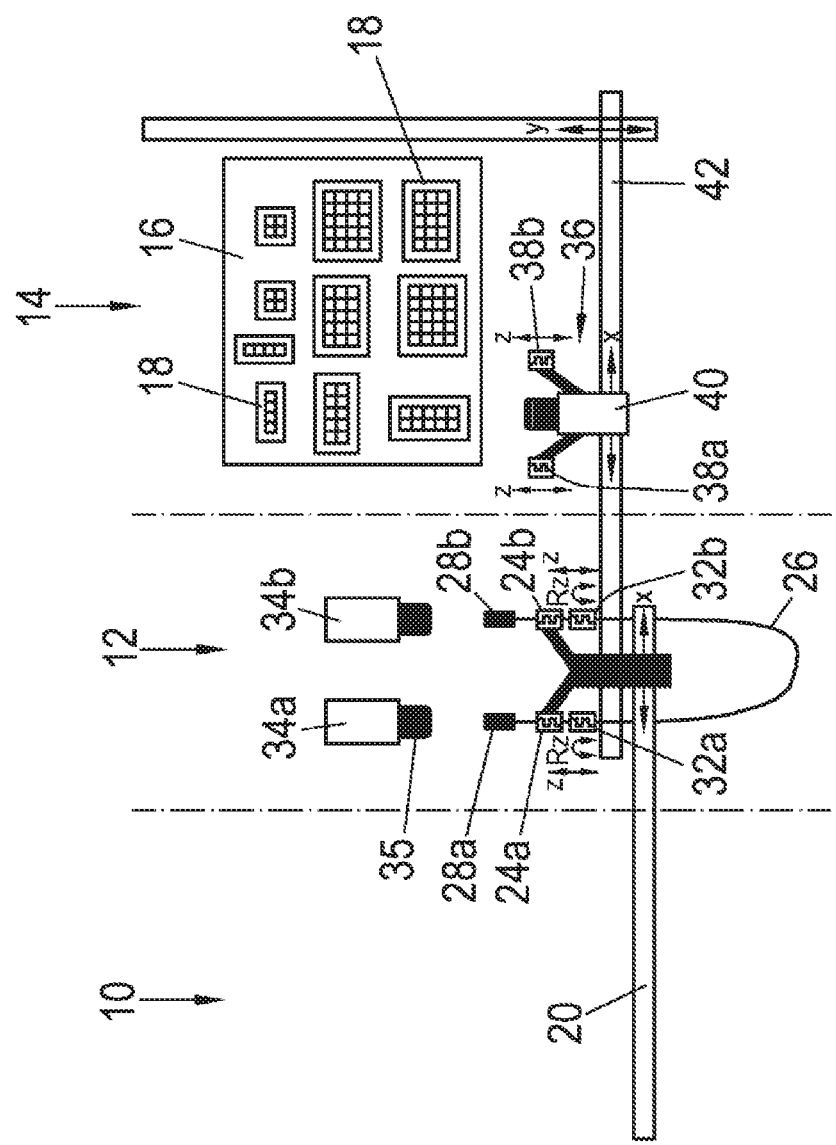
FIG. 2 depicts the mounting device of FIG. 1 during the transfer of the electrical line to an alignment-station in accordance with one embodiment.

During normal operation of the mounting device, a prefabricated electrical line 26 with two contact-parts 28a, 28b attached to ends is taken from a component supply, not shown, and, as shown in FIG. 1, is brought into a provisioning position by means of the supply-grippers 24a, 24b. In doing so, crimping noses of the contact-parts 28a, 28b can always point upwards, for example. The contact-parts 28a, 28b are then moved to the alignment-station 12 by means of the first-positioning-system 20 and transferred to the alignment-grippers 32a, 32b. This transfer is shown in FIG. 2. After the transfer, the supply-grippers 24a, 24b are moved back to their original positions, and it is immediately started with the provision of another electrical line 26.

Figure 3:
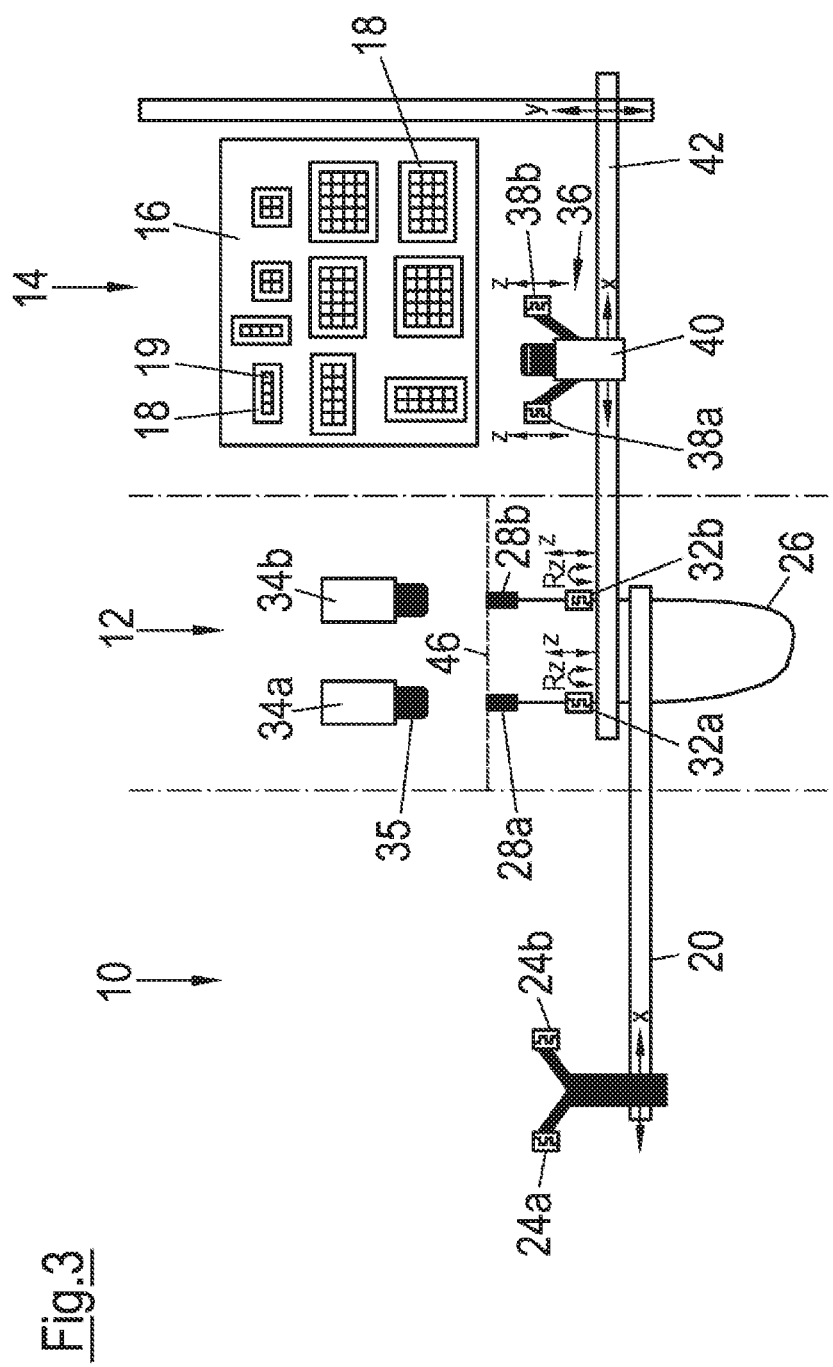
FIG. 3 depicts the mounting device of FIG. 1 during an alignment process in accordance with one embodiment.

The alignment-grippers 32a, 32b perform an alignment process by initially determining an actual-rotational-position of the held contact-parts 28a, 28b in relation to the respective rotation-axis Rz by means of the alignment-cameras 34a, 34b and the associated image-processing-systems. The lenses 35 of the alignment-cameras 34a, 34b are each focused on the front-end-faces 44a, 44b (FIG. 1) of the held contact-parts 28a, 28b. Subsequently, the determined actual-rotational-position is compared to a rotational-position predetermined by the characteristics and arrangement of the connector-housing 18 to be mounted. Based on the result of the comparison, a rotational-position-correction is performed by appropriately rotating the alignment-grippers 32a, 32b. In addition, the two contact-parts 28a, 28b are displaced along the respective rotation-axis Rz by means of the alignment-grippers 32a, 32b, as necessary, so that the front-end-faces 44a, 44b of the contact-parts 28a, 28b are on a common reference line 46 extending perpendicular to the rotation-axes Rz (FIG. 3).

Figure 4:
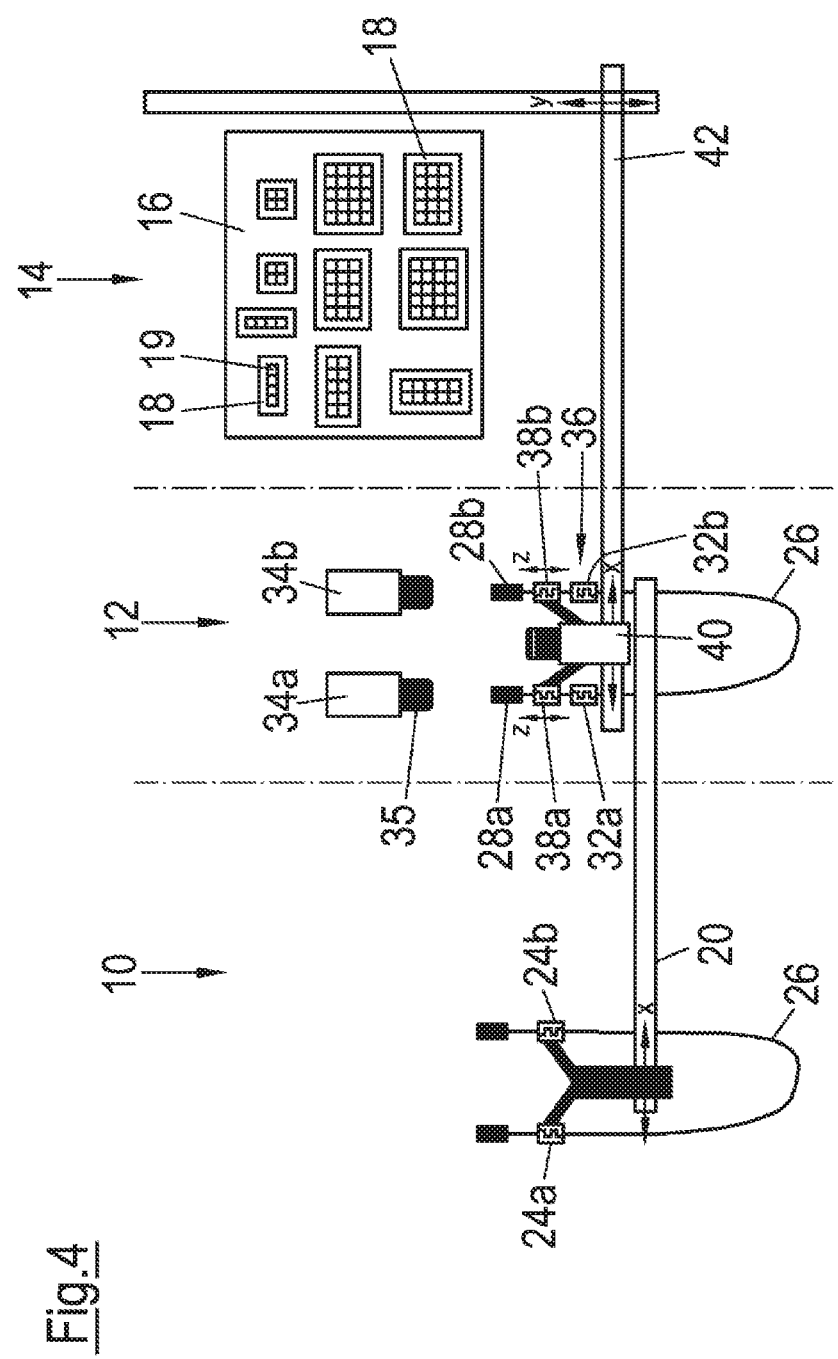
FIG. 4 depicts the mounting device of FIG. 1 during the transfer of the electrical line to a mounting-station in accordance with one embodiment.

The mounting-unit 36 is subsequently or even during the alignment process moved to the alignment-station 12. There, the two ends of the electrical line 26 with the contact-parts 28a, 28b are transferred from the alignment-grippers 32a, 32b to the mounting-grippers 38a, 38b, as shown in FIG. 4. The transfer is carried out, while avoiding a rotation of the contact-parts 28a, 28b. With the use of the alignment-cameras 34a, 34b, potential deviations of the positions of the contact-parts 28a, 28b are determined in a x-y plane perpendicular to the rotational axes Rz in relation to the respective reference positions.

Figure 5:
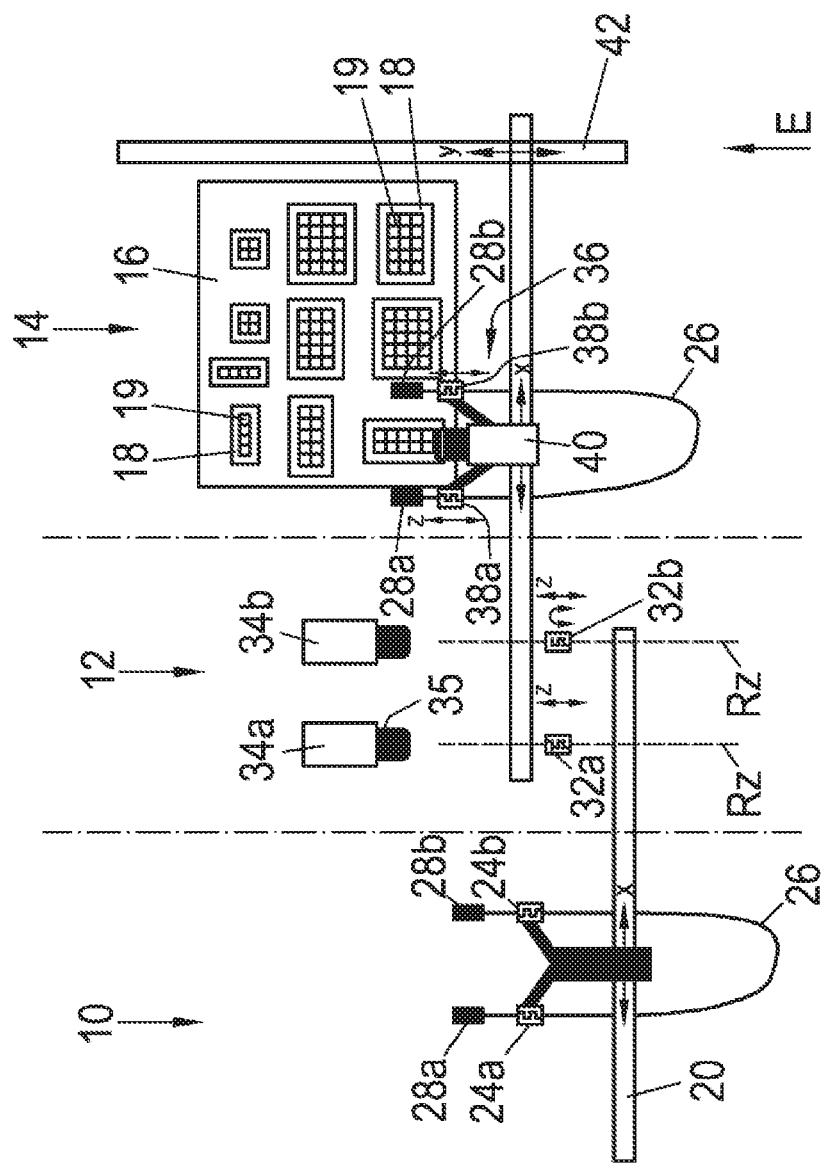
FIG. 5 depicts the mounting device of FIG. 1 prior to insertion of the contact-parts into respective cavities of connector-housings in accordance with one embodiment.

The mounting-unit 36 is then positioned together with the electrical line 26 by means of the second-positioning-system 42 in the x-y plane in front of the desired connector-housing 18 (FIG. 5). The mounting-camera 40 of the mounting-unit 36 determines the exact position, including any minor rotations of the respective connector-housing 18 in relation to a predetermined reference-position associated with the mounting-camera 40. The determined position deviations and rotations are temporarily stored in a control-device, not shown, and used for mounting operations on other cavities 19 of the respective connector-housing 18. The positions of the cavities 19 of a given connector-housing 18 in relation to a reference-position are taken from a higher-level database.

Figure 6:
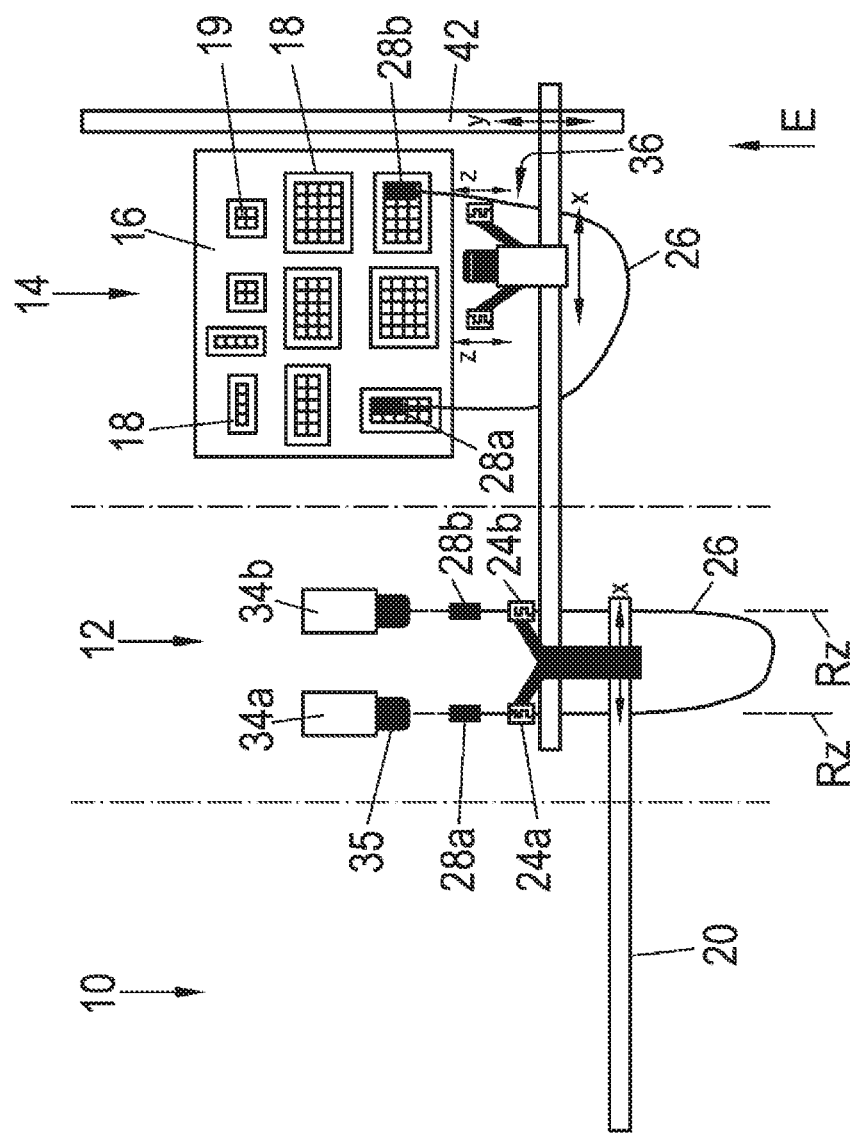
FIG. 6 depicts the mounting device of FIG. 1 after insertion of the contact-parts into the cavities in accordance with one embodiment.

Due to a calibration of the mounting device performed before starting operation, to be described in more detail below, the exact positions of the tips of the contact-parts 28a, 28b in relation to the reference-position of the mounting-camera 40 are known. The mounting-unit 36 is now positioned in the x-y plane by the second-positioning-system 42 so that the contact-part 28a located to the left in the image is arranged in front of the cavity 19 to be mounted. By movement of the associated mounting-gripper 38a in an insertion-direction E, the contact-part 28a is inserted into the cavity 19 and optionally locked thereto. The same process is repeated with the other contact-part 28b and the cavity 19 corresponding thereto, so that the state shown in FIG. 6 is created. As illustrated in FIGS. 5 and 6, the insertion-direction E is parallel to the rotation axes Rz.

For the various connector-housings 18 which are fixed to the holder 16, the position of the connector-housing 18 is captured by the mounting-camera 40 only at the first contact-part 28a, 28b, respectively. For all other contact-parts 28a, 28b for the respective connector-housing 18, the temporarily stored position data are used.

During the mounting process, a further electrical line 26 with attached contact-parts 28a, 28b is provided by means of the supply-grippers 24a, 24b and transported to the alignment-station 12 and the process begins again. If necessary, it is possible to use only a single alignment-gripper 32a and only one alignment-camera 34a at the alignment-station 12.

FIG. 7 illustrates a calibration method for the mounting device according to the invention, which is carried out using a marking-carrier 48 and two 52a, 52b. As part of this calibration method, first the marking-carrier 48, which may be for example a paper or foil element, is attached to the holder 16. Respective marking-devices 52a, 52b instead of ends of the electrical line 26 are gripped by the mounting-grippers 38a, 38b. The marking-devices 52a, 52b are generally shown as arrows in FIG. 7 and, in practice, may be configured as pins, needles, laser heads or thermal elements, for example. The first mounting-gripper 38a is moved along a horizontal line. In a uniform distance of 10 mm, for example, the movement is respectively stopped and the mounting-gripper 38a is moved in the insertion-direction E towards the marking-carrier 48 until the tip of the marking-device 52a contacts therewith and thus sets a marking-point 55. Subsequently, another row of marking-points 55 is created with altered Y position. The row by row setting of marking-points 55 is repeated until the entire marking-carrier 48 is covered by a grid-like array of points, as shown.

After the setting of all marking-points 55, the mounting-camera 40 of the mounting-unit 36 is successively moved to the individual marking-points 55 by the second-positioning-system 42 and the positions of the marking-points 55 on the marking-carrier 48 are determined by the displacement-position of the second-positioning-system 42 and the position of the marking-point 55 in the captured image. The thus determined positions of the marking-points 55 are stored together with the displacement coordinates of the second-positioning-system 42 in a storage-device. Subsequently, the calibration method is repeated with the second-mounting-gripper 38b and its associated marking-device 52b.

During a subsequent normal operation of the mounting device, the respective displacement coordinates of the second-positioning-system 42 can be determined from the positions of the connector-housings 18 at the holder 16 using the stored data. Here, intermediate values can be determined by suitable mathematical methods, for example by an interpolation method. Any deviations from an orthogonal and linear movement of the mounting-unit 36, which for example lead to a trapezoidal, cushion-like or barrel-like distortion of the grid-like array of points, are determined by the calibration file and can be compensated accordingly in terms of control.

Overall, the invention enables a particularly reliable and fast mounting of connector-housings 18 with electrical lines 26.

Accordingly, a device and method for mounting a connector-housing is provided. The alignment process ensures that each provided contact-part is in the correct rotational-position before the insertion process. The reliability of the mounting process can be considerably increased by the automatic rotational-position-correction.

While this invention has been described in terms of the preferred embodiments thereof, it is not intended to be so limited, but rather only to the extent set forth in the claims that follow.

The invention claimed is:

1. A mounting device, comprising:
   a holder for retaining a connector housing defining a cavity within the connector housing;
   a movable gripper configured to releasably retain a contact part attached to an electrical line, wherein the movable gripper is operable to insert the contact part into the cavity of the connector housing along an insertion direction;
   an alignment station configured to present the contact part attached to the electrical line to the movable gripper, wherein the alignment station includes an alignment gripper configured to releasably retain the contact part wherein the alignment gripper is distinct from the movable gripper, wherein the alignment gripper is configured to rotate the contact part about a rotation axis parallel to the insertion direction, and wherein the alignment gripper retains the contact part by gripping the electrical line;
   an alignment camera configured to determine an actual rotational position of the contact part retained by the alignment gripper in relation to the rotation axis as the alignment gripper rotates the contact part about the rotation axis; and
   a control device configured to compare the actual rotational position determined via the alignment camera with a predetermined rotational position based on contact part characteristics and an arrangement of the connector housing, wherein the control device controls the alignment gripper to perform a corrective rotational movement based on the result of the comparison of the actual rotational position determined via the alignment camera with the predetermined rotational position.

2. The mounting device according to claim 1, wherein the alignment gripper is designed to rotate the contact part retained by the alignment gripper by greater than 180° and wherein the alignment gripper is moveable in a first direction along the rotation axis and in a second direction perpendicular to the rotation axis.

3. The mounting device according to claim 1, wherein the mounting device further includes a mounting camera configured to determine a position of the connector housing in relation to the predetermined rotational position and wherein the movable gripper and the mounting camera form a mounting unit configured for common movement.

4. The mounting device, wherein the alignment camera is focused on front end faces of the contact part.

5. The mounting device according to claim 1, wherein the movable gripper includes a first double gripper.

6. The mounting device according to claim 5, wherein the first double gripper holds two contact parts attached to opposing ends of the electrical line.

7. The mounting device according to claim 1, wherein the movable gripper holds the contact part attached to the electrical line by gripping the electrical line.

8. The mounting device according to claim 1, wherein the alignment gripper includes a second double gripper.

9. The mounting device according to claim 8, wherein the second double gripper holds two contact parts attached to opposing ends of the electrical line.

10. The mounting device according to claim 9, wherein the alignment camera is a first alignment camera, wherein the mounting device includes a second alignment camera, and wherein an image of each of the two contact parts is separately captured by the first or second alignment camera.

11. The mounting device according to claim 9, wherein the two contact parts are each moved along a respective rotation axis by the second double gripper such that front end faces of the two contact parts are positioned on a common reference line extending perpendicular to each of the rotation axes.

12. A mounting device, comprising:
   a holder for retaining a connector housing defining a cavity within the connector housing;
   a movable gripper configured to releasably retain a contact part attached to an electrical line, wherein the movable gripper is operable to insert the contact part into the cavity of the connector housing along an insertion direction;
   an alignment station configured to present the contact part attached to the electrical line to the movable gripper, wherein the alignment station includes an alignment gripper configured to releasably retain the contact part, wherein the alignment gripper is distinct from the movable gripper, and wherein the alignment gripper is configured to rotate the contact part about a rotation axis parallel to the insertion direction;
   an alignment camera configured to determine an actual rotational position of the contact part retained by the alignment gripper in relation to the rotation axis as the alignment gripper rotates the contact part about the rotation axis;

a control device configured to compare the actual rotational position determined via the alignment camera with a predetermined rotational position based on contact part characteristics and an arrangement of the connector housing, wherein the control device controls the alignment gripper to perform a corrective rotational movement based on the result of the comparison of the actual rotational position determined via the alignment camera with the predetermined rotational position; and a supply station having a movable supply gripper operable to present the contact part attached to the electrical line to the alignment station.

13. The mounting device according to claim 12, wherein the movable supply gripper includes a third double gripper.

14. The mounting device according to claim 13, wherein the third double gripper holds two contact parts attached to opposing ends of the electrical line.

15. A mounting device, comprising:
a holder for retaining a connector housing defining a cavity within the connector housing;
a movable gripper configured to releasably retain a contact part attached to an electrical line, wherein the movable gripper is operable to insert the contact part into the cavity of the connector housing along an insertion direction;
an alignment station configured to present the contact part attached to the electrical line to the movable gripper, wherein the alignment station includes an alignment gripper configured to releasably retain the contact part, wherein the alignment gripper is distinct from the movable gripper, and wherein the alignment gripper is configured to rotate the contact part about a rotation axis parallel to the insertion direction;

an alignment camera configured to determine an actual rotational position of the contact part retained by the alignment gripper in relation to the rotation axis as the alignment gripper rotates the contact part about the rotation axis;

a control device configured to compare the actual rotational position determined via the alignment camera with a predetermined rotational position based on contact part characteristics and an arrangement of the connector housing, wherein the control device controls the alignment gripper to perform a corrective rotational movement based on the result of the comparison of the actual rotational position determined via the alignment camera with the predetermined rotational position and a supply station having a first positioning system in a form of a uniaxial linear system, wherein the first positioning system is configured to move two adjacent supply grippers which are combined into a third double gripper.

16. The mounting device according to claim 15, wherein the mounting device further includes a mounting station having a mounting unit including two mounting grippers and a mounting camera with an associated image processing system.

17. The mounting device according to claim 16, wherein, a second positioning system in a form of a two axis linear system is configured to move the mounting unit in front of individual connector housings fixed to the holder.

18. The mounting device according to claim 17, wherein, the first positioning system and the second positioning system overlap with each other in an area of the alignment station, such that a transfer of contact parts between the the adjacent supply grippers and the two mounting grippers is possible.

* * * * *